(12) United States Patent
Kim

(10) Patent No.: US 6,169,451 B1
(45) Date of Patent: Jan. 2, 2001

(54) SYSTEM FOR SENSING OPERATING STATE OF TOWER TOP AMPLIFIER FOR MOBILE COMMUNICATION SYSTEM AND METHOD OF SENSING THE SAME

(75) Inventor: Wang Rae Kim, Seoul (KR)

(73) Assignee: LG Information & Communications Ltd., Seoul (KR)

( * ) Notice: Under 35 U.S.C. 154(b), the term of this patent shall be extended for 0 days.

(21) Appl. No.: 09/203,339

(22) Filed: Dec. 2, 1998

(30) Foreign Application Priority Data

Dec. 27, 1997 (KR) .................................................. 97-75436

(51) Int. Cl.[7] ...................................................... H03F 3/68
(52) U.S. Cl. ........................................ 330/124 D; 455/115
(58) Field of Search ........................... 330/124 D, 124 R, 330/207 P, 298; 455/115

(56) References Cited

U.S. PATENT DOCUMENTS

| | | | |
|---|---|---|---|
| 4,565,972 | * | 1/1986 | Kaegebein ........................ 330/124 D |
| 5,418,490 | * | 5/1995 | Kaegebein ........................ 330/124 D |
| 5,987,037 | * | 11/1999 | Gans .................................... 455/103 |
| 6,016,123 | * | 1/2000 | Barton et al. ........................ 455/422 |

* cited by examiner

*Primary Examiner*—Benny Lee
*Assistant Examiner*—Khanh Van Nguyen
(74) *Attorney, Agent, or Firm*—Fleshner & Kim, LLP

(57) ABSTRACT

A system for sensing the operating state of a tower top amplifier for mobile communication system, includes a plurality of tower top amplifiers each connected to communication antennas; and an operating state management part monitoring the operating state of each tower top amplifier. The operating state management part monitors the operating state of each tower top amplifier by the use of a single power supply line connected between itself and each tower top amplifier. In a method of sensing the operating state of a tower top amplifier for mobile communication system, the operating state of each tower top amplifier is monitored by using an amount of consumed DC power applied to the respective tower top amplifiers. This method includes the steps of measuring a potential difference of a given section of the DC power applied to each tower top amplifier; and comparing a result obtained by the measuring step and determining the normal or abnormal states of the tower top amplifiers.

25 Claims, 4 Drawing Sheets

SYSTEM FOR SENSING OPERATING STATE OF TOWER TOP AMPLIFIER FOR MOBILE COMMUNICATION SYSTEM AND METHOD OF SENSING THE SAME

BACKGROUND OF THE INVENTION

1. Field of the Invention

The present invention relates to a system for sensing the state of a tower top amplifier connected to a base station in the mobile communication system, and a method of sensing the same. More particularly, it relates to a system for sensing the state of a tower top amplifier which is more simple than a conventional art in linkage and may enhance the reliability of the sensing operation, and further relates to a method of sensing the same.

2. Discussion of Related Art

A tower top amplifier may be installed at a place near each base station in the mobile communication system, if necessary. This prevents degradation of the performance of the base station (receive sensitivity) because there is a cable loss from an outdoor antenna of the base station to indoor receiving terminal's amplifier. According to the general statistics, the cable loss per 50 m is about 3 dB. Installing the tower top amplifier increases the receive sensitivity, cell coverage area, and the capacity of subscribers with saving the battery life of a mobile terminal, and decreases the shading area, thus increasing the use of tower top amplifiers. Therefore, it is very important that the base station monitors whether or not the operating state of each tower top amplifier is normal.

FIG. 1 is a block diagram showing the connection of a base station 5 and tower top amplifiers. Referring to FIG. 1, a plurality of tower top amplifiers 1a to 1n are installed near base station 5's outdoor antennas AT1 to ATn. Base station 5 provides direct current (DC) power to all tower top amplifiers 1a to 1n through respective power supply lines P1 to Pn, and each tower top amplifier 1a to 1n self-monitors the operating state, while being exposed to the outside, and transmits its result to base station 5.

If one of tower top amplifiers 1a to 1n is in an abnormal operating state, the corresponding tower top amplifier gives an alarm signal. This alarm signal is transmitted to a multiplexer 2 for a given period of time. Each one of the tower top amplifiers in the normal state periodically transmits its operating state to multiplexer 2. Multiplexer 2 collects signals output from the normal and abnormal amplifiers and transmits them to a demultiplexer 4 through a signal line S0. Multiplexer 2 is installed outdoors near tower top amplifiers 1a to 1n, and modulates the alarm signals of the respective tower top amplifiers 1a to 1n to appropriate signals to transmit them to demultiplexer 4 of base station 5. The reason why the signals are modulated by demultiplexer 4 is that one signal line S0 is used to transmit signals from multiplexer 2 to base station while signal lines S1 to Sn are used to transmit signals from respective tower top amplifiers 1a to 1n to multiplexer 2. The modulated signals from multiplexer 2 are demultiplexed by demultiplexer 4 and the operating state of each tower top amplifier 1a to 1n is transmitted to base station 5. Demultiplexer 4 is generally installed near base station 5 or within base station 5.

In the above system for sensing the operating state of the tower top amplifier, power supply lines P1 to Pn are each connected between tower top amplifiers 1a to 1n and base station 5, and signal lines S1 to Sn are each connected between multiplexer 2 and tower top amplifiers 1a to 1n. Accordingly, the more the number of the tower top amplifiers is increased, the more the overall system becomes complexed. In addition, since multiplexer 2 is installed outside of base station 5, it is exposed to the weather and may be out of order. The operating states of the multiplexer and demultiplexer, receiving the operating state of respective tower top amplifiers 1a to 1n, should be monitored, and in order to do this, extra equipment is required.

SUMMARY OF THE INVENTION

Accordingly, the present invention is directed to a system for sensing the operating state of a tower top amplifier for a mobile communication system and a method of sensing the same that substantially obviate one or more of the problems due to limitations and disadvantages of the related art.

An object of the present invention is to provide a system for sensing the operating state of a tower top amplifier for a mobile communication system which is capable of monitoring the operating state of each tower top amplifier by using the amount of power consumption of the power supply line, and a method of sensing the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention discloses a system for sensing the operating state of each tower top amplifier for mobile communication system, includes a plurality of tower top amplifiers each connected to communication antennas; and an operating state management part monitoring the operating state of each tower top amplifier. The operating state management part monitors the operating state of each tower top amplifier by the use of a single power supply line connected between itself and each tower top amplifier.

The operating state of each tower top amplifier is monitored by using an amount of consumed direct current (DC) power applied to each tower top amplifier from a base station through each power supply line.

According to another aspect of the present invention, in a method of sensing the operating state of each tower top amplifier for mobile communication system, the operating state of each tower top amplifier is monitored by using an amount of consumed DC power applied to the respective tower top amplifiers.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings:

DETAILED DESCRIPTION OF PREFERRED EMBODIMENT

Reference will now be made in detail to the preferred embodiments of the present invention, examples of which are illustrated in the accompanying drawings.

Figure 1:
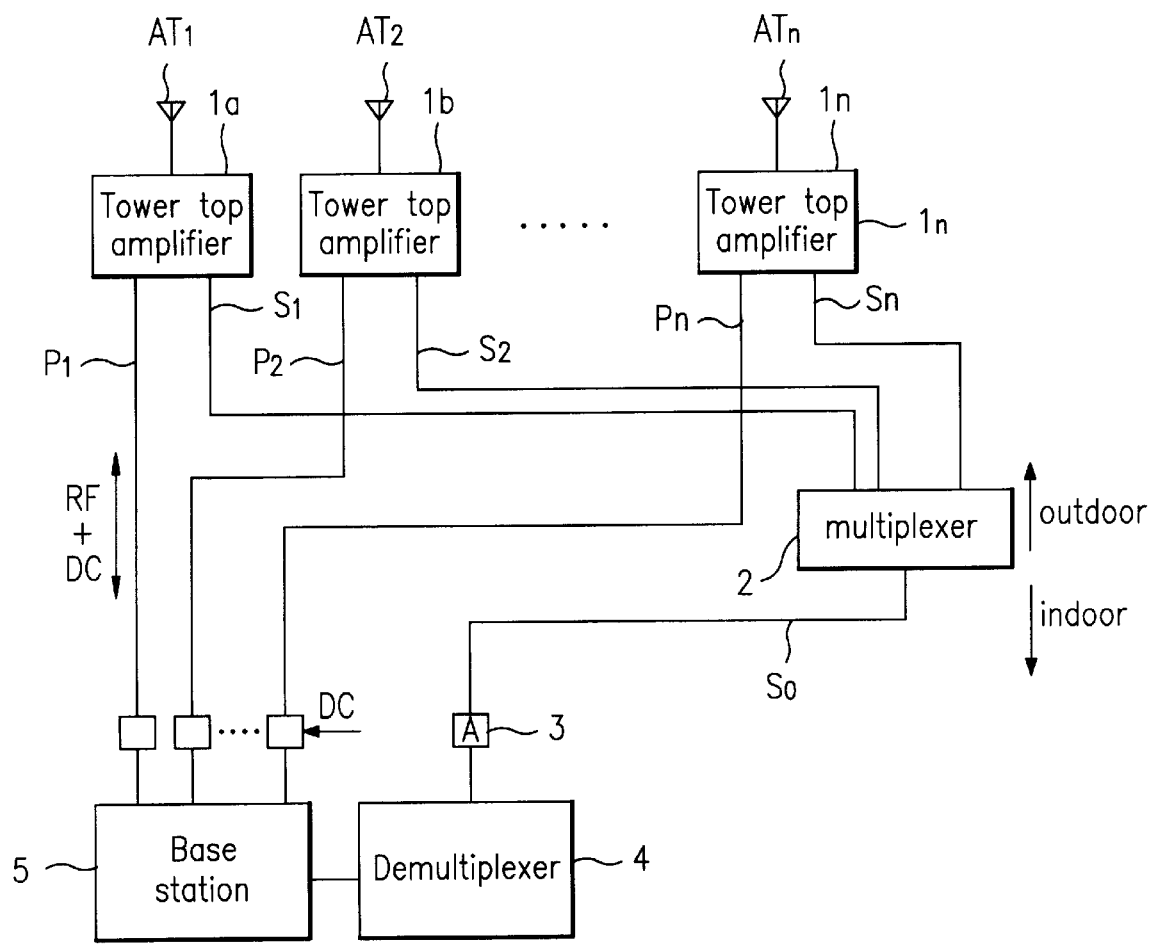
FIG. 1 is a block diagram showing the connection between a base station and tower top amplifiers in accordance with a conventional art.
Figure 2:
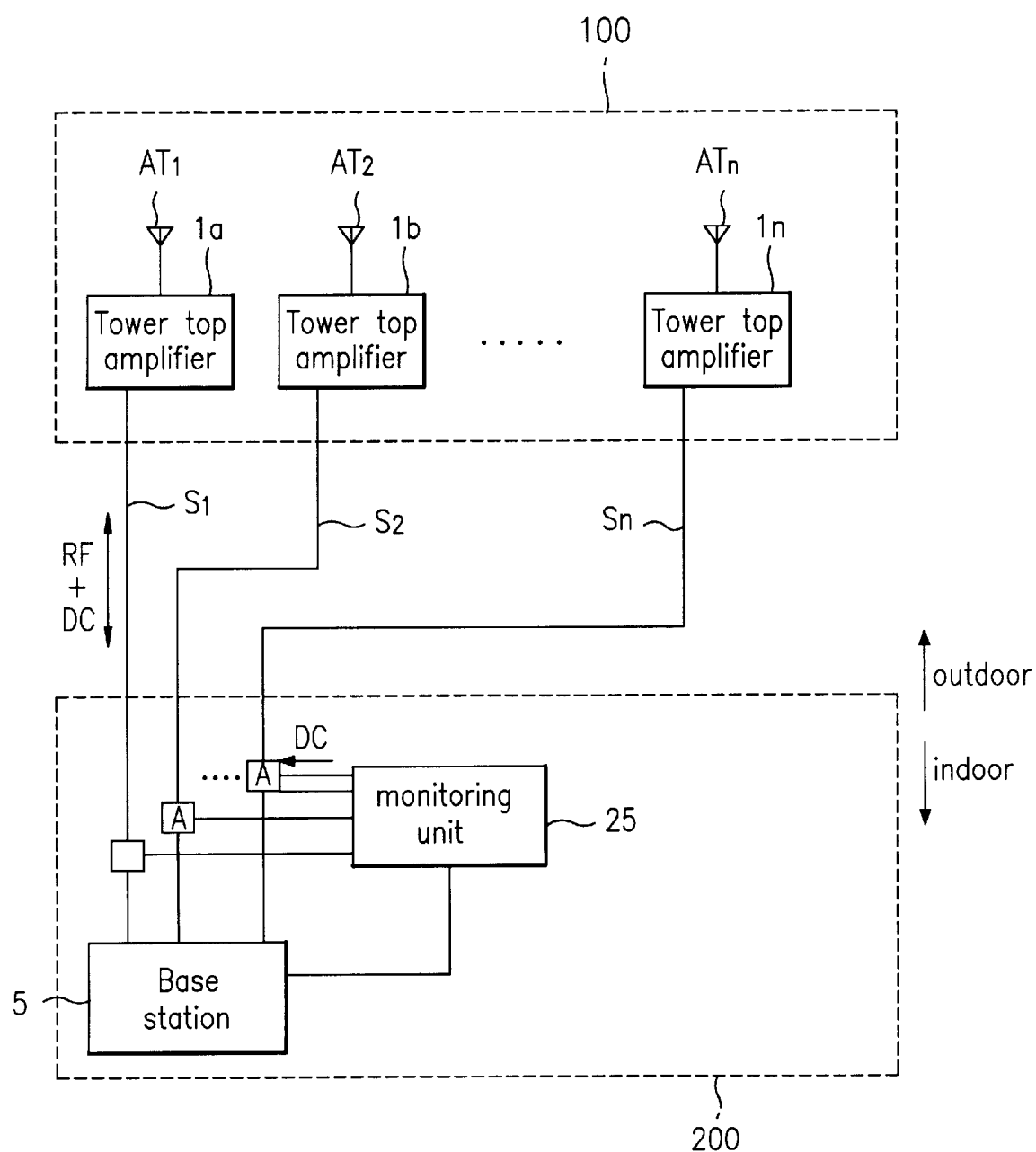
FIG. 2 is a block diagram showing the connection between a base station and tower top amplifiers in accordance with the present invention.

FIG. 2 is a block diagram showing the connection between a base station and tower top amplifiers in accordance with the present invention.

Referring to FIG. 2, the inventive system includes a signal amplifying part 100 having a plurality of tower top amplifiers 1a to 1n in each connected to communication antennas AT1 to ATn, and an operating state management part 200, including a monitoring unit 25, sensing the operating state of each tower top amplifier 1a to 1n.

Signal amplifying part 100 includes a band-pass filter 11 which removes a band of radio frequency signals applied through its receiving antenna; a low-noise amplifier 12 that increases the amplitude of the overall output signals with maximally suppressing the amplification of noisy signals contained in signals output from band-pass filter 11; a bias tee 13 which prevents a surge and separates the DC power and radio frequency signals from the input signal; and first and second switches SW1 and SW2 each provided to both terminals of low-noise amplifier 12 and turned on when the DC power is applied thereto from the base station, and turned off when low-noise amplifier 12 is out of order.

Figure 3:
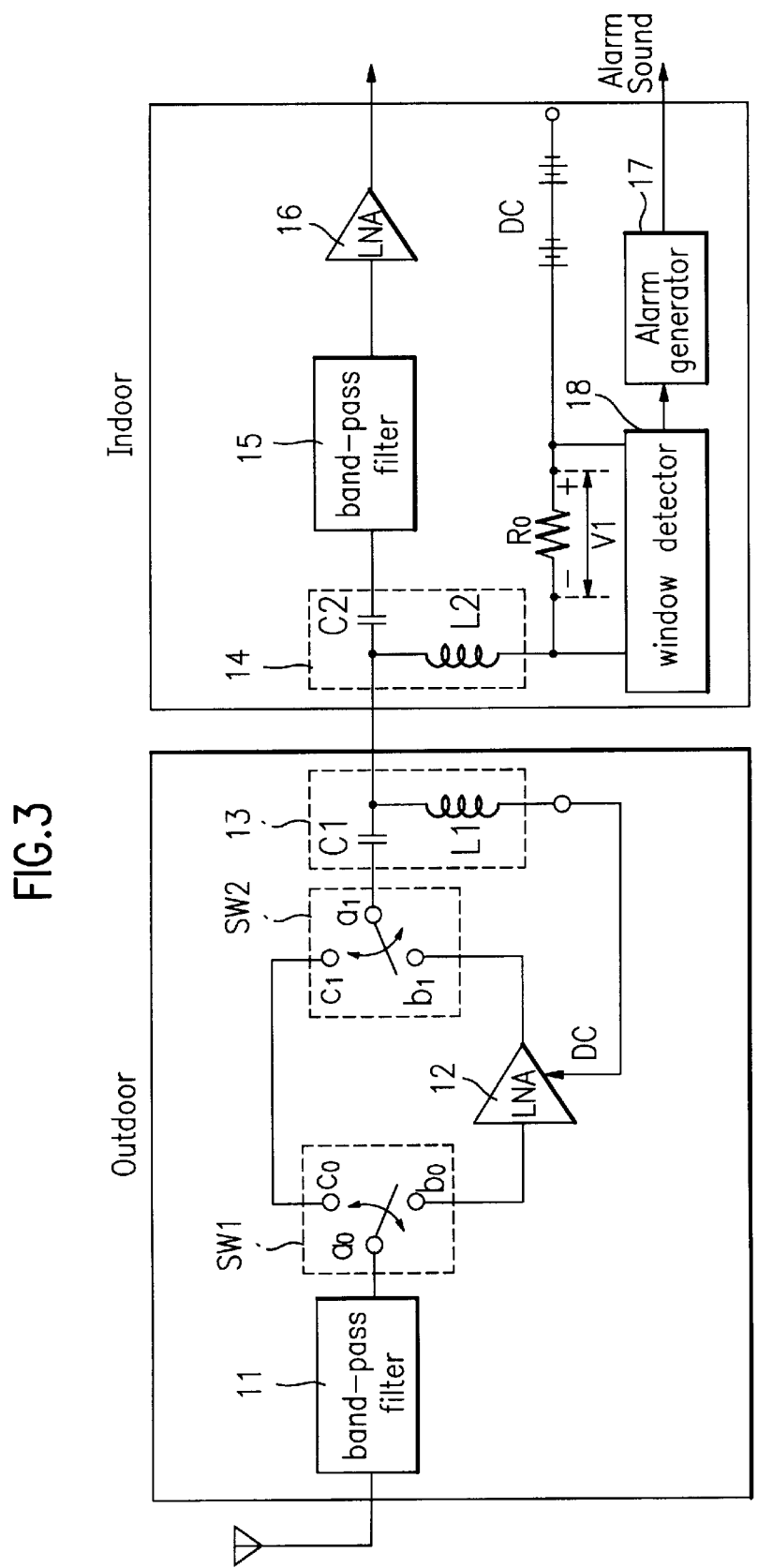
FIG. 3 is a block diagram of a system for sensing the operating state of tower top amplifiers in accordance with the present invention.

Operating state management part 200, as shown in FIG. 3, includes a bias tee 14 which prevents a surge from the outside and separates the DC power and radio frequency signals from the input signals; a band-pass filter 15 which removes an unnecessary band of radio frequency signals; a low-noise amplifier 16 that increases the amplitude of the overall output signals with maximally suppressing the amplification of noisy signals contained in signals output from band-pass filter 11; a window detector 18 which detects the DC power applied to signal amplifying part 100 to judge the amount of power consumption; and an alarm generator 17 which gives an alarm signal if window detector 18 determines that a corresponding tower top amplifier is in an abnormal state.

An output signal of low-noise amplifier 16 is provided to the base station's receiving terminal so the general signal processing steps are performed. Each tower top amplifier 1a to 1n shown in FIG. 2 self-monitors the operating state and does not require the function announcing its operating state to a manager, thus assuring the more reliable monitoring.

The steps of sensing the operating state of each tower-top amplifier are described with reference to the attached drawings.

Each tower top amplifier 1a to 1n distributes radio frequency signals applied through respective antennas AT1 to ATn by using a 90° 3 dB coupler, and increases the amplitude of the respective distributed signals thereby producing a single output signal by the use of 90° 3 dB coupler. Accordingly, each of the applied radio frequency signal has two paths within the tower top amplifier, and if two paths all fail, it is transmitted to bias tee 13 without passing through the corresponding one of tower top amplifiers 1a to 1n.

The DC power driving each tower top amplifier 1a to 1n is applied thereto through corresponding power supply lines S1 to Sn by using bias tee 14 of base station 5. Each tower top amplifier 1a to 1n receives the DC power, and applies it to bias tee 13 of signal amplifying part 100, low-noise amplifier 12, and switches SW1 and SW2. If the DC power is applied to second switch SW2's input terminal a1, their contacts are a0–b0 and a1–b1 each so that switches SW1 and SW2 are turned on. If not so, their contacts are a0–c0 and a0–c0 each, and switches SW1 and SW2 are turned off.

Thus, the amount of power consumed by a radio frequency (RF) device placed within low-noise amplifier 12 in signal amplifying part 100 depends on the operating state of each tower top amplifier 1a to 1n. The operating state of each tower top amplifier 1a to 1n is easily monitored by measuring the amount of power consumption in operating state management part 200. A very small resistor R0 (about 0.1 Ω or 1 Ω in this preferred embodiment) is connected in series between the DC power and bias tee 14, and the amount of power consumption can be found from a potential difference V1 of resistor R0's both nodes. That is, according to Ohm's law (V=1×R) potential difference V1 between resistor R0's both nodes is big as the consumed electric current is more increased than a threshold value. As the consumed electric current is more decreased than potential difference V1, potential difference V1 of resistor R0's both nodes becomes decreased, and the amount of power consumption is obtained by computing a value of potential difference V1.

The operating state of each tower top amplifier 1a to 1n can be monitored by detecting the range of the voltage applied to resistor R0 corresponding to that of electric current by which tower top amplifiers 1a to in operate normally. The voltage applied to resistor R0's both nodes is measured by window detector 18.

Figure 4:
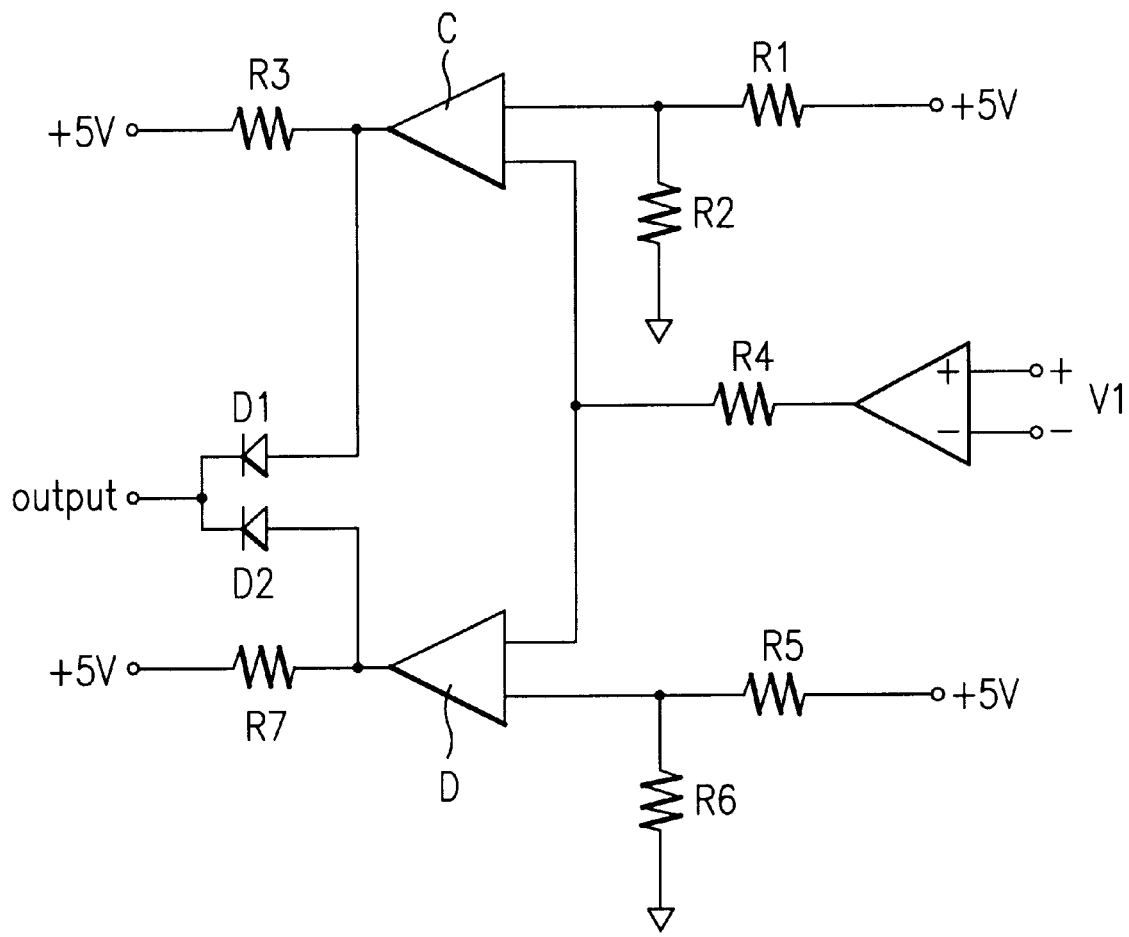
FIG. 4 is a circuit diagram of a window detector shown in FIG. 3.

In this embodiment of the present invention, window detector 18 consists of two voltage comparators, as shown in FIG. 4.

The operation of window detector 18 is now described in more detail.

If the DC power applied to tower top amplifiers 1a to 1n is smaller than (R2×5)/(R1+R2), an output voltage of OP-AMP C becomes 5V, and if the applied voltage is larger than (R2×5)/(R1+R2), an output voltage of OP-AMP C becomes 0V. On the contrary, if the DC power, applied to each tower top amplifier 1a to 1n, is smaller than (R6×5)/(R5+R6), an output voltage of an OP-AMP D is 0V. If the applied voltage is larger than (R6×5)(R5+R6), the output voltage of OP-AMP D becomes 5V. When adding outputs of the two voltage comparators having two features by the use of diodes D1 and D2, the final output voltage is as follows:

(R6×5)/(R5+R6)≦input≦(R2×5)/(R1+R2: Output voltage=0V;
(R6×5)/(R5+R6)≧input, or input≧(R2×5)/(R1+R2): output voltage=5V.

Therefore, a range of a certain applied voltage can be found, thus easily monitoring the operating state of each tower top amplifier 1a to 1n.

According to the present invention, the operating state of each tower top amplifier can be monitored while a single power supply line is connected between the base station and each tower top amplifier. Thus, there is no need to employ a device for monitoring the operating state of each tower top amplifier, and a multiplexer and a demultiplexer for collecting the operating states of the tower top amplifiers and transmitting them to the base station and receiving the same so that the overall system is more simple in structure than the prior art and the operating state of each tower top amplifier is more reliably monitored.

It will be apparent to those skilled in the art that various modifications and variations can be made in the system for sensing the operating state of each tower top amplifier of the present invention without departing from the spirit or scope of the invention. Thus, it is intended that the present invention cover the modifications and variations of this invention provided they come within the scope of the appended claims and their equivalents.

What is claimed is:

1. A system for sensing the operating state of a tower top amplifier for mobile communication system comprising:
   a plurality of tower top amplifiers each connected to communication antennas; and
   an operating state management circuit, which monitors an operating state of each tower top amplifier, wherein each of the tower top amplifiers is coupled to the operating state management circuit by a respective transmission line carrying RF signals and a DC signal, and wherein the operating state management circuit monitors the operating state of each tower top amplifier based on at least one of the RF and DC signals on the associated transmission line.

2. A system according to claim 1, wherein the operating state management circuit monitors the operating state of each tower top amplifier using an amount of direct current (DC) power provided to each tower top amplifier by a base station through each transmission line.

3. A system according to claim 1, wherein each tower top amplifier includes a low-noise amplifier.

4. A system according to claim 1, wherein each tower top amplifier distributes the inputted radio frequency signals by using a 90° 3 dB coupler, and amplifies the distributed signals.

5. A system according to claim 4, wherein if all two paths fail, the radio-frequency signal, inputted from the low-noise amplifier, is bypassed to a bias tee.

6. A system according to claim 3, further comprising a band-pass filter between the low-noise amplifier's input terminal and a receiving antenna to remove an unnecessary band of radio frequency signals.

7. A system according to claim 3, further comprising a bias tee at the low-noise amplifier separating DC signals and radio frequency signals from the inputted signals.

8. A system according to claim 3, further comprising first and second switching devices at both terminals of the low-noise amplifier, wherein said switching devices are turned on if the base station applies DC power to said switching devices, and said switching devices are turned off if the base station does not provide DC power or the low-pass filter in the tower top amplifier is out of order.

9. A system according to claim 1, wherein the operating state management circuit comprises:
   a window detector to detect an amount of consumed power by detecting a potential difference of the DC power provided to the tower top amplifiers; and
   an alarm generator to produce an alarm signal if the window detector determines that a corresponding one of the tower top amplifiers is in an abnormal state.

10. A system according to claim 9, wherein the window detector includes at least two voltage comparators.

11. A system according to claim 9, further comprising a bias tee provided to the operating state management circuit's input terminal to separate the DC signal and radio frequency signals from the inputted signals.

12. A system according to claim 9, further comprising at least one resistor provided to the section for measuring a potential difference of the DC power provided to the tower top amplifier.

13. The system of claim 1, wherein the transmission line is a power supply line.

14. The system of claim 7, wherein the bias tee is configured to prevent a power surge.

15. A system for sensing the operating state of each of a plurality of tower top amplifiers, comprising:
   a signal amplifying circuit connected to a plurality of communication antennas to amplify radio frequency signals inputted from a receiving antenna;
   an operating state management circuit to sense whether or not the signal amplifying circuit is operating normally; and
   a bias tee circuit to separate the radio frequency signals and a DC power signal provided on a single power supply line.

16. A system according to claim 15, wherein the signal amplifying part includes a plurality of tower top amplifiers amplifying the received radio frequency signals.

17. A system according to claim 16, wherein the signal amplifying circuit comprises:
   a power supply line to receive the DC power signal from a base station;
   a filter to remove an unnecessary band of radio frequency signals received from the receiving antenna;
   a low-noise amplifier to remove unnecessary frequency signals from the signal output by the filter and to amplify the output signals of the filter;
   a bias tee to separate the DC power signal and radio frequency signals; and
   at least one switch connected to the low-noise amplifier and turned on or off by the DC power signal applied from the base station, wherein the DC power signal and the radio frequency signal are carried on the power supply line.

18. A system according to claim 15, wherein the operating state management circuit comprises:
   a bias tee to prevent a surge from the tower top amplifiers;
   a resistor to measure an amount of the power consumed by the respective tower top amplifiers;
   a window detector to detect a potential difference of the power applied to the respective tower top amplifiers and the amount of the power consumed by the tower top amplifiers; and
   a low-noise amplifier to amplify radio frequency signals applied from the tower top amplifiers.

19. A system according to claim 18, wherein the operating state management circuit further comprises means for announcing the operating state of each tower top amplifier to a manager.

20. A system according to claim 18, wherein the window detector includes at least two voltage comparators.

21. A system according to claim 18, wherein the operating state of each tower top amplifier is determined by a potential difference between the resistor's nodes.

22. A method of sensing the operating state of a tower top amplifier for mobile communication system, comprising:
   measuring a potential difference of a given section of DC power applied to each tower top amplifier; and
   comparing a result obtained by the measuring step to determine the normal or abnormal states of the tower top amplifiers, wherein the operating state of each tower top amplifier is monitored by using an amount of consumed DC power provided to the respective tower top amplifiers.

23. A method according to claim 22, wherein the measuring step is performed by computing a value of the potential difference of the DC power applied to each tower top amplifier.

24. A method according to claim 23, wherein if the value of the potential difference is larger than a threshold value, corresponding tower top amplifier indicates in a normal state, and if the value of the potential difference is smaller than the threshold value, corresponding tower top amplifier indicates in an abnormal state.

25. A method according to claim 22, wherein the determining step is performed by using voltage comparators.

* * * * *